United States Patent [19]
Lin

[11] Patent Number: 5,219,117
[45] Date of Patent: Jun. 15, 1993

[54] METHOD OF TRANSFERRING SOLDER BALLS ONTO A SEMICONDUCTOR DEVICE

[75] Inventor: Paul T. Lin, Austin, Tex.

[73] Assignee: Motorola, Inc., Schaumburg, Ill.

[21] Appl. No.: 786,629

[22] Filed: Nov. 1, 1991

[51] Int. Cl.$^5$ .................. B23K 35/14; B23K 37/00
[52] U.S. Cl. ................................. 228/253; 228/41; 228/246
[58] Field of Search ............... 228/246, 248, 253, 254, 228/41

[56] References Cited

U.S. PATENT DOCUMENTS

| | | | |
|---|---|---|---|
| 4,722,470 | 2/1988 | Johary | 228/180.2 |
| 4,898,320 | 2/1990 | Dunaway et al. | 228/245 |

FOREIGN PATENT DOCUMENTS

| | | | |
|---|---|---|---|
| 0307591 | 3/1989 | European Pat. Off. | 228/179 |
| 1-278967 | 11/1989 | Japan | 228/179 |
| 2-278831 | 11/1990 | Japan | 228/41 |

OTHER PUBLICATIONS

"CRC Handbook of Chemistry and Physics," edited by R. C. Weast et al., CRC Press, Inc., Boca Raton, Fla., 60th Edition, 1979, p. D-189.

"Microelectronics Packaging Handbook," edited by R. R. Tummala et al., Van Nostrand Reinhold, New York, 1989, p. 36.

R. J. Herdzik et al., "Tinning Preplated Sites on a Substrate," IBM Tech. Disclosure Bull., vol. 19, No. 8 (Jan. 1977) pp. 3049-3050.

*Handbook of Chemistry and Physics*, 44th Ed., The Chemical Rubber Publishing Co., Cleveland, Ohio, 1962, pp. 2328-2329.

*Primary Examiner*—Richard K. Seidel
*Assistant Examiner*—Jeffrey T. Knapp
*Attorney, Agent, or Firm*—Patricia S. Goddard

[57] ABSTRACT

Solder balls are transferred onto a semiconductor device (50), for example a flip chip semiconductor device, without using solder evaporation techniques. In one form, pre-formed solder balls (36) are placed in recesses (32) formed in a transfer substrate (30). A semiconductor die (12) having a plurality of bond pads (14) is positioned with respect to the transfer substrate so that the solder balls are aligned to, and in contact with, the bond pads. The solder balls are then reflowed to form a metallurgical bond to the bond pads. One embodiment of the invention utilizes a transfer substrate made of silicon so that the coefficient of thermal expansion of the transfer substrate will closely match that of the semiconductor die, thereby minimizing solder ball alignment variances. Use of silicon as a transfer substrate material also allows the recesses to easily be made non-wettable by conventional silicon oxidation techniques.

15 Claims, 3 Drawing Sheets

METHOD OF TRANSFERRING SOLDER BALLS ONTO A SEMICONDUCTOR DEVICE

FIELD OF THE INVENTION

This invention is related to semiconductor devices in general, and more specifically to methods of transferring solder balls onto a semiconductor device, such as a flip chip semiconductor device.

BACKGROUND OF THE INVENTION

Flip chip semiconductor devices utilize solder bumping technology as a method of providing interconnection from a semiconductor die, also known as a chip, to a package or substrate. Rather than employing lead members, a in wire bonding and TAB (tape automated bonding) techniques, flip chip devices have solder bumps formed on bond pads of a semiconductor die. These solder bumps are then coupled directly to a substrate such as a printed circuit (PC) board. In order to couple the solder bumps directly to the substrate, the die must be turned over to a face-down position, thus the term "flip chip."

In fabricating a flip chip device, several processing steps are required after traditional semiconductor die fabrication. Solder bumps are not generally formed directly on bond pads of a semiconductor die. Instead, one or more metals is deposited onto the bond pads to form a terminal pad. As an example of conventional terminal pad metallurgy, a series of chrome, copper, and gold layers is deposited onto the bond pads prior to actual solder bump formation. The terminal pad metallurgy is used to prevent contaminants such as chlorine from attacking the bond pad. Terminal pads also provide a better solderable surface than traditional aluminum bond pads. Solder does not effectively wet aluminum surfaces; therefore, solder balls formed on aluminum bond pads generally have very poor adhesion. Materials used to form terminal pads on the bond pads can be chosen to serve both as a barrier to contamination and as a solder-wettable surface.

After any layers of terminal pad metallurgy have been formed on a flip chip device, solder is selectively evaporated onto the device. A shadow mask, usually made of metal, is positioned over the device during the evaporation process. The mask is provided with openings which correspond to the bond pad configuration of the device. Solder is deposited onto the mask and through the openings onto the bond pads, or on the terminal pads if present. Following deposition, the evaporated solder on the bond pads of the device is reflowed. Reflowing the solder causes the solder to soften and take on a semispherical shape due to surface tension forces, much like a water droplet on a glass or plastic surface. Due to this semi-spherical shape, solder bumps are also commonly referred to as solder balls. The solder bumps are then cooled, such that a metallurgical bond is created between the solder and the bond pad or terminal pad metallurgy.

There are several disadvantages with existing flip chip device fabrication processes, such as that described above. A significant disadvantage of the process is cost. The evaporation of solder is expensive due to equipment costs and the lengthy amount of time required to deposit solder onto the device. In addition, evaporation chambers require frequent cleaning to remove solder which has been deposited onto chamber walls. The chamber cleaning process is not only costly, but is also environmentally and physically hazardous. Another disadvantage with existing solder bump techniques is that shadow masks are required. The masks, which are often made of molybdenum, are expensive and must be replaced periodically. After each use, the masks must be cleaned to remove solder from the mask. Depending on the type of mask cleaning process used, the mask itself might be etched, resulting in changes in the size of the openings through which solder is deposited. Furthermore, differences in the coefficient of thermal expansion between the mask and the semiconductor device create alignment problems. The mask will expand at elevated temperatures, including evaporation temperatures, at a different rate than the device. Therefore, openings in the mask may no longer align to the bond pad locations. Yet another disadvantage with existing solder bump processes is that the composition of the solder bump is difficult to control. Although a solder of a specific composition can be evaporated onto bond pads, reflowing the solder results in a composition differential between various portions of the solder bump. Because the partial pressure of lead is greater than the partial pressure of tin, more lead will end up in the bottom portion of the bump (i.e. the portion adjacent the bond pad) than at the top of the bump. As a result, it is difficult to control and optimize solder bump composition.

SUMMARY OF THE INVENTION

The present invention overcomes the above-mentioned disadvantages with existing solder bump technologies. In one form of the invention, a method for fabricating a semiconductor device involves providing a semiconductor substrate having a plurality of semiconductor die formed thereon. Each die has a plurality of bond pads in predetermined locations. A transfer substrate is provided which includes a plurality of recesses formed therein. Each recess location in the transfer substrate corresponds to a bond pad location on the semiconductor substrate. A conductive ball is positioned in each recess of the transfer substrate. The semiconductor substrate and transfer substrate are then positioned such that each conductive ball aligns to, and is in contact with, a corresponding bond pad. The conductive balls are then reflowed and metallurgically bonded to the corresponding bond pads.

These and other features, and advantages, will be more clearly understood from the following detailed description taken in conjunction with the accompanying drawings. It is important to point out that the illustrations may not necessarily be drawn to scale, and that there may be other embodiments of the present invention which are not specifically illustrated.

BRIEF DESCRIPTION OF THE DRAWINGS

FIG. 4 illustrates a method of transferring solder balls from the FIG. 5 is a cross-sectional view of the portion of the semiconductor die of FIG. 4 after solder balls have been metallurgically bonded to the bond pads of the semiconductor die in accordance with a method of the present invention.

DETAILED DESCRIPTION OF A PREFERRED EMBODIMENT

As discussed above, existing methods for forming solder bumps or solder balls on a semiconductor device have several disadvantages. In addition to being costly and time consuming, most existing solder bump processes require the use of metal masks called shadow masks. The use of shadow masks often causes problems in aligning the solder bumps to the bond pads on a device due to coefficient of thermal expansion differences. Also, shadow mask cleaning may result in dimensional changes of openings formed in the mask, openings through which solder is deposited. Changing the size of the openings in the mask directly affects the size and location of solder bumps on a device. Another problem with existing methods is that composition of the solder bumps varies throughout the bump due to differences in the partial pressures of lead and tin. After solidification, the bumps will contain a higher concentration of lead near the interface with the bond pad than in other portions of the bump.

The present invention provides a method for forming solder bumps or solder balls on a semiconductor device which does not involve solder evaporation techniques used in conventional solder bumping processes. As a result, use of the present invention provides a cost savings and a reduction in fabrication time. Furthermore, since evaporation techniques are not used, there is no need to employ a shadow mask and hazardous evaporation chamber cleaning is avoided. In accordance with the present invention, solder balls are pre-formed and are then transferred onto the device, rather than forming bumps or balls directly on a semiconductor device by evaporation. Because the solder balls are pre-formed, composition of the balls can be well controlled. Alignment of the solder balls onto bond pads of a semiconductor device is also more controllable with the present invention. In one embodiment, a transfer substrate used to transfer the solder balls has a coefficient of thermal expansion which closely matches that of the semiconductor device. Therefore, the solder balls will accurately correspond to the bond pad locations. These features and advantages are explained in more detail below.

Figure 1:
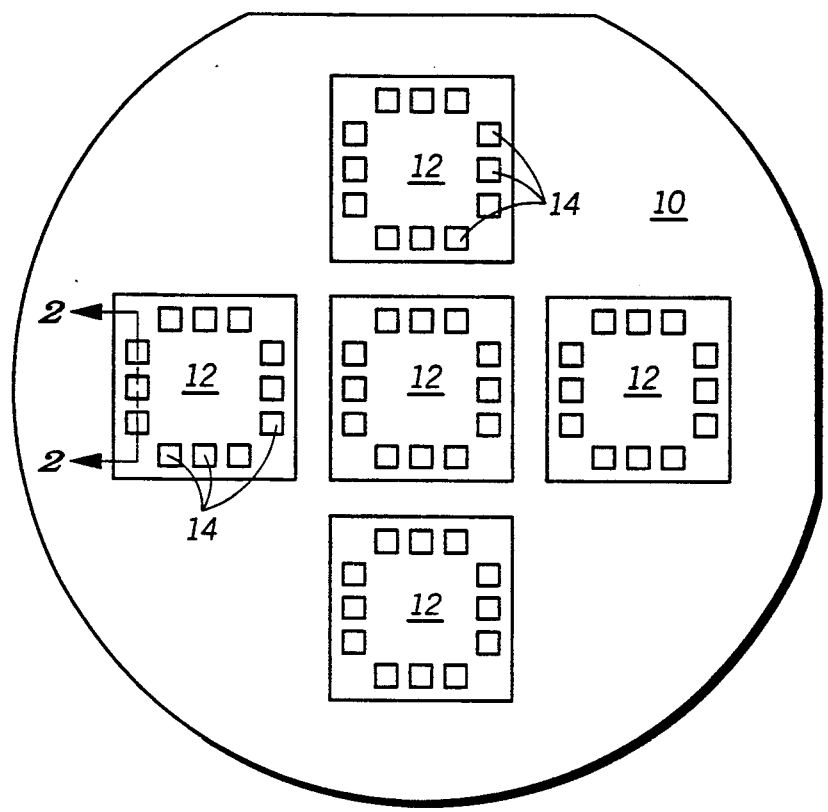
FIG. 1 is a planar view of a semiconductor device wafer suitable for use in a method in accordance with the present invention.

FIG. 1 illustrates a semiconductor device wafer 10 having a plurality of semiconductor die 12 formed thereon. Wafer 10 is usually of a semiconductor material such as silicon, gallium arsenide, or the like. Although only five die are illustrated on the wafer in FIG. 1, the number of die on a given semiconductor substrate is not important in practicing the invention. Furthermore, the functionality of the die (e.g. whether the die is a memory device, a microprocessor, a bipolar device, a gate array, etc.) is irrelevant in practicing the invention. Each die 12 has a plurality of bond pads 14 formed on a surface of the die. The exact number of bond pads formed on a die, and the location of these bond pads on the die surface will vary, depending on the specific requirement of that particular die.

Figure 2:
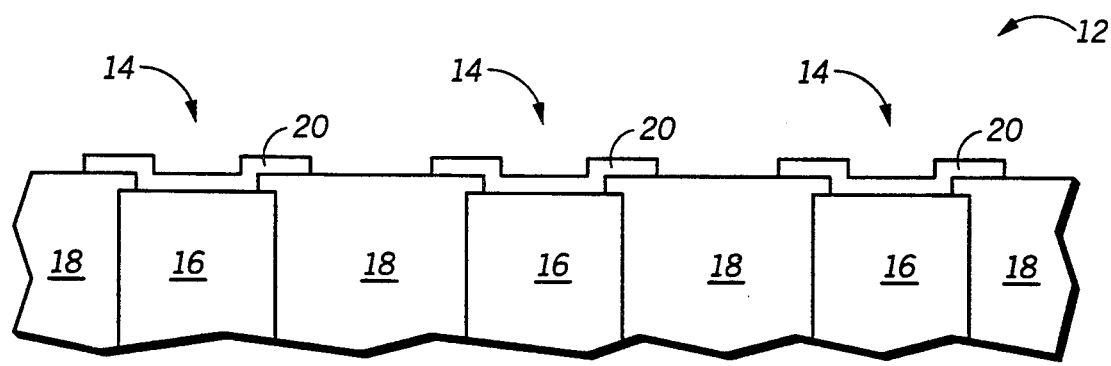
FIG. 2 is a cross-sectional view of a portion of a semiconductor die taken along the line 2—2 of FIG. 1 in accordance with a method of the present invention.

As indicated previously, bond pads often include one of more layers of terminal pad metallurgy. FIG. 2 is a cross section of a portion of one of the semiconductor die 12 of FIG. 1 taken along the line 2—2 which illustrates terminal pad metallurgy. Bond pads 14 include a terminal pad 20 formed partially over a die passivation layer 18 and partially over a metal pad 16. Most metal pads in semiconductor devices are formed of aluminum or an aluminum alloy. Many solder compositions do not wet aluminum surfaces; therefore, terminal pad 20 is provided as a solder-wettable surface. Terminal pads also act as a sealant for the bond pad, protecting the underlying metal pad from external contaminants. Although terminal pads 20 are illustrated as being made of one material, it is important to realize that terminal pad metallurgy with respect to this invention may be formed of one or more layers of material. For example, terminal pads 20 may be a composite of chrome, copper, and gold layers or chrome, nickel, and gold layers. Terminal pads 20 are formed on metal pads 16 using known techniques. One known technique is to sputter deposit metallurgy on the entire die surface and pattern the metal layer or layers using lithography techniques. Another known method of forming terminal pads is to selectively deposit the terminal pad material by using a shadow mask, similar to the selective solder deposition process described earlier. It is important to note that use of terminal pad metallurgy on a bond pad, although being a preferred embodiment of the invention, is not required to practice the invention.

Figure 3:
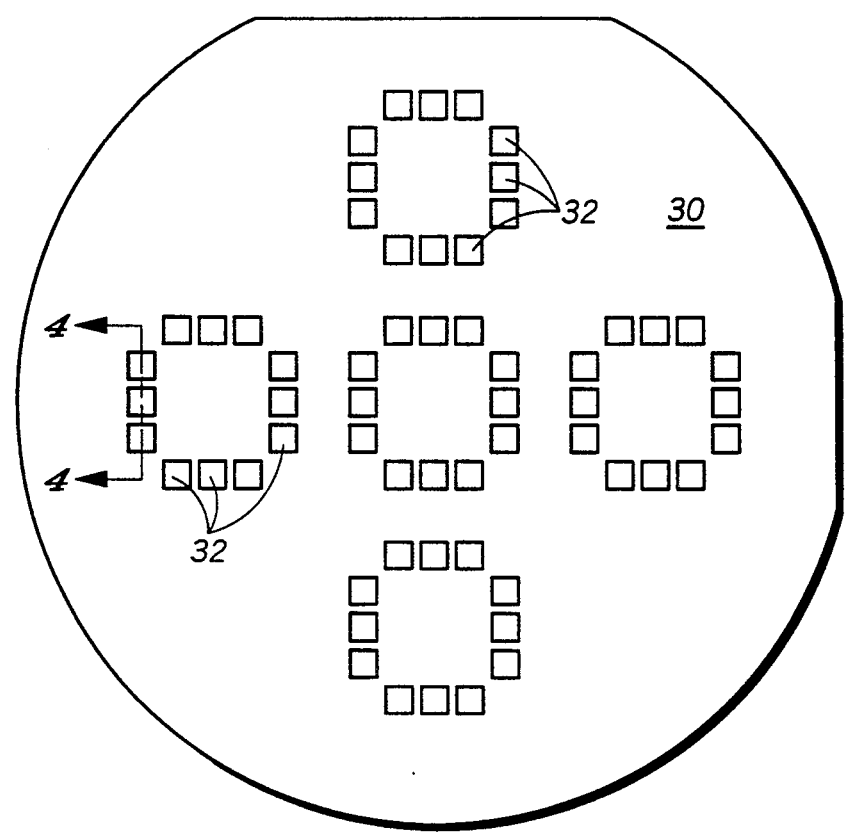
FIG. 3 is a planar view of a transfer substrate suitable for use in a method in accordance with the present invention.

In accordance with the present invention, solder balls are attached to bond pads of a semiconductor die by employing a transfer substrate, such as a transfer substrate 30 illustrated in FIG. 3. In one embodiment of the present invention, transfer substrate 30 is of a material which has a coefficient of thermal expansion (CTE) substantially equal to the coefficient of thermal expansion of semiconductor device wafer 10. A suitable range of CTE values for transfer substrate 30 is about $3-7 \times 10^{-6}/°C$. for the semiconductor wafer materials commonly used in device fabrication. The advantage in using a transfer substrate with a CTE close to that of the semiconductor device wafer will be addressed in a subsequent discussion relating to FIG. 4. A preferred embodiment of the invention uses a silicon transfer substrate because most semiconductor device wafers are also made of silicon. Not only is a silicon transfer substrate ideal for matching the CTE of a silicon wafer, but silicon is also inexpensive and easy to process. Other suitable materials for transfer substrate 30 include glasses and ceramics, among others.

Formed in transfer substrate 30 is a plurality of recesses 32 as illustrated in FIG. 3. In accordance with the present invention, recesses 32 correspond in location to the locations of bond pads 14 of semiconductor device wafer 10. Silicon processing is well understood in the art; therefore, recesses 32 can easily be formed in a silicon transfer substrate using known semiconductor lithography and etching techniques. Although recesses are illustrated as being square, this is not a requirement of the invention. Nor is the invention limited by dimensions of the recesses. The shape and size of recesses 32 are, however, important for proper alignment of solder balls, as will become evident below.

Figure 4:
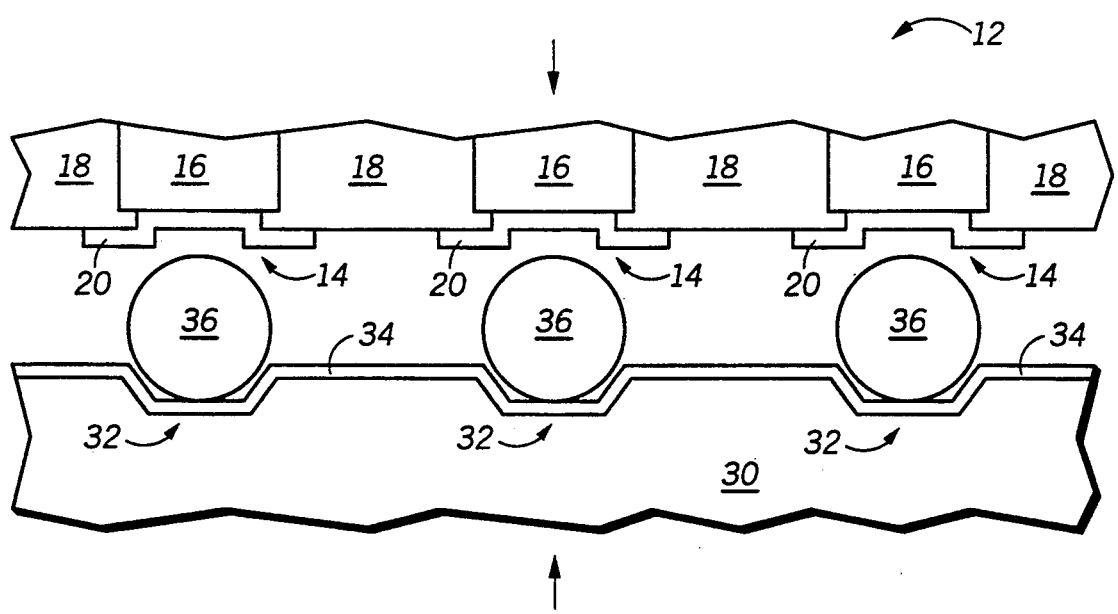
FIG. 4 is a cross-sectional view of a portion of the transfer substrate taken along the line 4—4 of FIG. 3 and of a portion of a semiconductor die.

FIG. 4 illustrates how transfer substrate 30 is used to attach solder balls to semiconductor die 12. For clarity purposes, only a portion of transfer substrate 30 (taken along the line 4—4 of FIG. 3) and a portion of semiconductor die 12 (taken along the line 2—2 of FIG. 1) are illustrated. In accordance with the present invention, a solder ball 36 is placed in each recess 32 of the transfer substrate. The size of recesses 32 will be a function of the size of solder balls 36. Generally, the size of the recesses should be large enough to securely hold solder balls 36, but small enough to prevent substantial movement of the solder ball within the recess. The recesses are used to align the solder balls to bond pads 14 of semiconductor die 12. To ensure proper alignment, it is important that there be little variability in the position of the solder ball within the recess. On the other hand, the smaller the recess, the more difficult it is to place a solder ball in each recess. Therefore, a compromise should be reached between solder ball alignment tolerances and ease of filling the recesses with solder balls.

In forming recesses in the transfer substrate, one may take advantage of existing semiconductor fabrication techniques. For instance, it may be possible to use the same mask to form the recesses in the transfer substrate as that used to form openings in passivation layer 18 to expose metal pads 16. In the fabrication of die 12, passivation layer 18 is typically deposited across the entire die surface and subsequently patterned and etched to expose metal pads 16. The same mask used to pattern the passivation openings could be used to pattern transfer substrate 30 to form recesses 32, depending on the size requirements of the recesses relative to the size of the passivation openings. One may also utilize etch processes common to semiconductor fabrication in forming the recesses. Etch chemistries known in the industry permit a wide variability in etch profiles, including anisotropic (one-directional) etches, isotropic (all-directional) etches and preferential (select-directional) etches. As FIG. 4 illustrates, one embodiment of the present invention utilizes a transfer substrate having recesses with slanted sidewalls. Slanted sidewalls, as opposed to vertical sidewalls, facilitate solder ball placement in the recesses. For instance, positioning solder balls in the recesses by rolling the balls across the top surface of transfer substrate 30 is easier if the recesses have slanted sidewalls. Slanted sidewalls can be easily formed in a silicon wafer by using existing etch chemistries which preferentially etch silicon along certain crystallographic planes, resulting in recesses with slanted sidewalls.

In bonding the solder balls to the bond pads of a semiconductor die in accordance with the present invention, die 12 is positioned over transfer substrate 30 in a face-down configuration, as illustrated in FIG. 4. The die and transfer substrate are positioned relative to one another so that bond pads 14 of the die overlie and are aligned with solder balls 36. The bond pads are then brought into contact with the solder balls, for instance by either lowering the die or raising the transfer substrate until the bond pads and solder balls touch. As stated earlier, there may or may not be terminal pad metallurgy on the bond pads. If a terminal pad, such as terminal pad 20, exists, solder balls 36 are brought into contact with the terminal pad metallurgy. If a terminal pad is not present, the solder balls are brought into direct contact with metal pads 16.

Once the solder balls are in contact with either the terminal pad metallurgy or the metal pads, the solder balls are reflowed and wetted to the bond pad surface. The temperature for reflowing the solder balls will vary, depending on the solder ball composition. In general, the reflow temperature will roughly be between 250° C. and 350° C. The advantage of using a transfer substrate with a CTE closely approximately that of the semiconductor die is relevant during the reflow process. During solder ball reflow, semiconductor die 12 and transfer substrate 30 will also be exposed to the reflow temperature. If the CTE values of these two materials are similar, the die and the transfer substrate will expand at the same rate during reflow, such that solder balls 36 will remain aligned to bond pads 14 throughout the entire reflow process. After the solder balls have been wetted to the bond pad surface during reflow, the solder balls are cooled such that a metallurgical bond is created between the solder balls and the respective bond pads.

In practicing the invention, it is beneficial to use a transfer substrate having a non-wettable surface. For example, transfer substrate 30 illustrated in FIG. 4 includes a non-wettable surface 34. If transfer substrate 30 is of silicon, non-wettable surface 34 could be a $SiO_2$ layer either grown or deposited onto the transfer substrate after recesses 32 have been formed. Other oxides and nitrides are also suitable for use as non-wettable surfaces. Additional non-wettable surfaces which could be used on a transfer substrate include TEFLON and other polymer resins. Alternatively, transfer substrate 30 may itself be formed of a non-wettable material, such as glass, in which case an additional non-wettable layer would not be necessary. The non-wettable surface facilitates the transfer of the solder balls from the transfer substrate to the semiconductor die. Once the solder balls are reflowed, the solder balls will adhere to the bond pads, which have a wettable surface, but will not adhere to the non-wettable surface on the transfer substrate. Thus, the solder balls will not be bonded to the transfer substrate upon cooling the solder ball, and the transfer substrate can readily be removed from the device.

Figure 5:
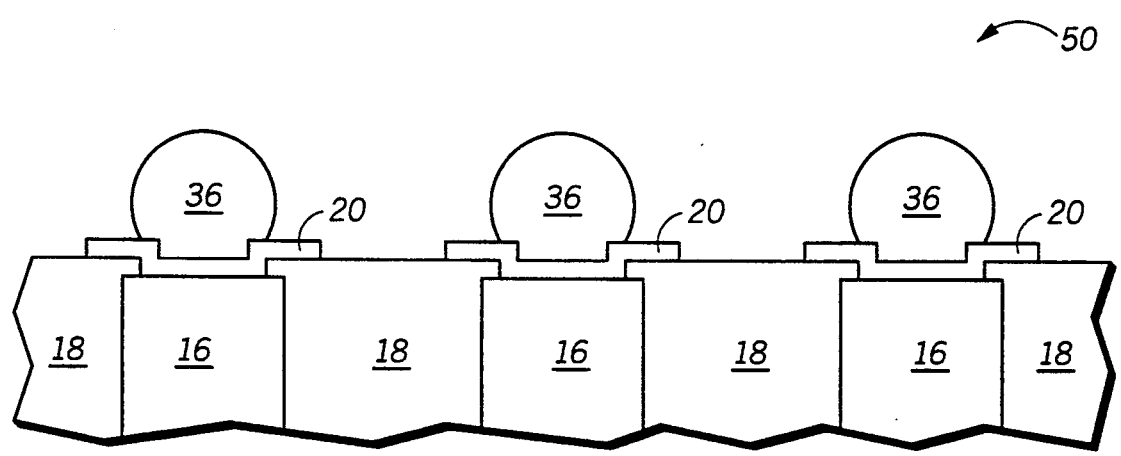

FIG. 5 illustrates in cross-section a portion of a semiconductor device 50 formed from the above mentioned process in accordance with the invention. Device 50 is structurally similar to devices formed using existing solder bumping techniques; however, using the present invention has several advantages over these existing techniques. One advantage is that the present invention does not utilize expensive and time-consuming solder evaporation techniques. A benefit in not using evaporation techniques is that the use of hazardous chamber cleaning processes is avoided. Another benefit in not using solder evaporation is that shadow masks are not required. Shadow masks used is in existing evaporation processes are generally expensive and require frequent cleaning and replacement. Furthermore, shadow masks are usually made of a material which expands at a different rate than the semiconductor die, making alignment of the solder bumps to the bond pads of the die difficult to control. A further benefit of not employing evaporation techniques is that the composition of the solder balls is consistent throughout the entire ball. The differences in partial pressure between lead and tin will not affect the composition of solder balls formed in accordance with the present invention because the solder balls are pre-formed. A reflow process used in accordance with the present invention to attach the pre-formed solder balls to the bond pads of the die is generally not sufficient to cause changes in the composition profile.

There are additional advantages in using the present invention if one chooses to use a silicon transfer substrate. Because most semiconductor die are formed on silicon, a silicon transfer substrate would have a near perfect match of CTE values with the semiconductor die. In addition, silicon is inexpensive and its properties are well understood due to its widespread use in the semiconductor industry. Known silicon processing techniques can be used to fabricate a transfer substrate. For example, oxidation of silicon can be performed to establish a non-wettable surface on the transfer substrate, and preferential silicon etching can be used to form recesses with slanted sidewalls.

Thus it is apparent that there has been provided, in accordance with the invention, a method for transferring solder balls onto a semiconductor device that fully meets the advantages set forth previously. Although the invention has been described and illustrated with reference to specific embodiments thereof, it is not intended that the invention be limited to these illustrative embodiments. Those skilled in the art will recognize that modifications and variations can be made without departing from the spirit of the invention. For example, the invention is not limited to forming solder bumps or solder balls on a semiconductor device, but is also applicable to forming any conductive ball or bump (such as a copper ball) on bond pads of a device surface. Also, solder balls used in practicing the invention may include other materials, such as indium, which modify wetting properties, melting temperatures, etc. of solder to enhance processing. In addition, the invention is not limited to forming balls on an entire semiconductor wafer at once. There may be occasions in which only a portion of a wafer or an individual die requires bumping. The present invention may be used on these occasions as well. It is also important to note that the present invention is not limited in any way to a particular transfer substrate material. Although silicon, glasses, and ceramics have been mentioned as preferred transfer substrate materials, other materials will also work well with the invention. Furthermore, it is not important what type of non-wettable surface is formed on the surface of the transfer substrate. In addition, it is important to recognize that solder balls formed in accordance with the invention may be coupled either directly to a metal pad portion of a bond pad, or to an intervening terminal pad metallurgy. Therefore, it is intended that this invention encompass all such variations and modifications as fall within the scope of the appended claims.

I claim:

1. A method for placing conductive balls onto a semiconductor device, comprising the steps of:
   providing a semiconductor substrate having a plurality of semiconductor die formed thereon, each die having a plurality of bond pads, each bond pad having a predetermined bond pad location;
   providing an oxidizable transfer substrate having recesses formed therein which do not extend completely through the transfer substrate, each recess having a location corresponding to one of the predetermined bond pad locations;
   oxidizing the transfer substrate to form a non-wettable surface on the substrate, including each recess;
   positioning a conductive ball in each oxidized recess in the transfer substrate;
   aligning the semiconductor substrate over the transfer substrate such that each conductive ball aligns to, and is in contact with, a corresponding bond pad; and
   reflowing the conductive balls such that the conductive balls are respectively metallurgically bonded to the corresponding bond pads.

2. The method of claim 1 wherein the step of providing a transfer substrate comprises providing a silicon transfer substrate having recesses formed therein.

3. The method of claim 1 wherein the semiconductor substrate and the transfer substrate each have a coefficient of thermal expansion and wherein the coefficient of thermal expansion of the transfer substrate and the coefficient of thermal expansion of the semiconductor substrate have equal orders of magnitude.

4. The method of claim 1 wherein the step of positioning a conductive ball in each recess comprises positioning a solder ball in each recess.

5. A method for transferring solder balls onto a semiconductor device, comprising the steps of:
   providing a semiconductor device having a plurality of bond pads on a first surface of the device, each bond pad having a predetermined location;
   providing a transfer substrate having a plurality of recesses formed in a first surface of the transfer substrate which do not extend completely through the transfer substrate, each recess having a location which corresponds to one of the predetermined locations of the plurality of bond pads;
   forming an oxide layer on the transfer substrate, including each recess, to establish a non-wettable surface;
   placing a solder ball in each recess of the transfer substrate such that the solder ball extends above the first surface of the transfer substrate;
   positioning the semiconductor device and the transfer substrate such that the first surface of the semiconductor device is opposite the first surface of the transfer substrate and each solder ball is aligned to, and in contact with, a respective one of the plurality of bond pads; and
   reflowing the solder balls to bond each solder ball to the respective bond pad.

6. The method of claim 5 wherein the semiconductor device and the transfer substrate each have a coefficient of thermal expansion and wherein the coefficient of thermal expansion of the transfer substrate and the coefficient of thermal expansion of the semiconductor device have equal orders of magnitude.

7. The method of claim 5 wherein the step of providing a transfer substrate comprises providing a transfer substrate having a coefficient of thermal expansion (CTE) substantially in the range of $3-7 \times 10^{-6}/°C$.

8. The method of claim 5 wherein the step of providing a semiconductor device having a plurality of bond pads comprises providing a semiconductor device having a plurality of bond pads, each bond pad comprises of a metal pad having overlying terminal pad metallurgy.

9. A method for transferring solder balls onto a semiconductor device, comprising the steps of:
   providing a semiconductor device wafer having a plurality of semiconductor die formed thereon, each die having a pattern of bond pads, the bond pads each having a solder-wettable surface;
   providing a silicon transfer substrate;
   etching the silicon transfer substrate to form a pattern of recesses in a surface of the transfer substrate wherein the recesses do not extend completely through the transfer substrate, the pattern of recesses corresponding in position to the pattern of bond pads of each of the plurality of semiconductor die;

forming an SiO$_2$ layer on the silicon transfer substrate and in each recess;

positioning a solder ball in each recess in the transfer substrate;

aligning the semiconductor device wafer over the transfer substrate such that each solder ball is aligned to, and in contact with, a respective one of the bond pads;

reflowing the solder balls such that each solder ball is wetted to the surface of the respective one of the bond pads; and cooling the solder balls such that each solder ball is metallurgically bonded to the surface of the respective one of the bond pads.

10. The method of claim 9 wherein the step of providing a semiconductor device wafer comprises providing bond pads which are each comprised of a metal pad having overlying terminal pad metallurgy.

11. The method of claim 5 wherein the step of forming an oxide layer comprises depositing an oxide layer on the transfer substrate surface.

12. The method of claim 5 wherein the step of providing a transfer substrate comprises providing a silicon transfer substrate.

13. The method of claim 12 wherein the step of forming an oxide layer comprises thermally oxidizing the silicon transfer substrate.

14. The method of claim 9 wherein the step of forming an SiO$_2$ layer comprises depositing an SiO$_2$ layer on the silicon transfer substrate surface.

15. The method of claim 9 wherein the step of forming an SiO$_2$ layer comprises thermally oxidizing the silicon transfer substrate.

* * * * *

UNITED STATES PATENT AND TRADEMARK OFFICE
CERTIFICATE OF CORRECTION

PATENT NO. : 5,219,117

DATED : June 15, 1993

INVENTOR(S) : Paul T. Lin

It is certified that error appears in the above-identified patent and that said Letters Patent is hereby corrected as shown below:

In claim 8, column 8, line 54
    change "comprises" to --comprised--.

Signed and Sealed this

Twenty-fourth Day of May, 1994

*Attest:*

BRUCE LEHMAN

*Attesting Officer*      *Commissioner of Patents and Trademarks*